United States Patent

Nagasawa et al.

[11] Patent Number: 6,015,467
[45] Date of Patent: Jan. 18, 2000

[54] METHOD OF REMOVING COATING FROM EDGE OF SUBSTRATE

[75] Inventors: Koichi Nagasawa; Naomi Kawaguchi; Futoshi Shimai, all of Kanagawa, Japan; Mitsuru Sato, Hillsboro, Oreg.; Kouji Harada; Jun Koshiyama, both of Kanagawa, Japan

[73] Assignee: Tokyo Ohka Kogyo Co., Ltd., Kanagawa, Japan

[21] Appl. No.: 08/859,926

[22] Filed: May 21, 1997

Related U.S. Application Data

[63] Continuation-in-part of application No. 08/857,485, May 16, 1997, and application No. 08/788,442, Jan. 28, 1997, Pat. No. 5,849,467, and application No. 08/612,723, Mar. 8, 1996, Pat. No. 5,688,411.

[30] Foreign Application Priority Data

May 21, 1996 [JP] Japan ..................... 8-125970

[51] Int. Cl.$^7$ .................. B08B 1/02; B08B 3/08; B08B 3/12
[52] U.S. Cl. .................. 134/1; 134/2; 134/32; 134/33; 134/34; 134/38
[58] Field of Search .................. 134/1, 38, 2, 32, 134/33, 34

[56] References Cited

U.S. PATENT DOCUMENTS

| 4,592,787 | 6/1986 | Johnson ..................... 134/38 |
| 4,886,728 | 12/1989 | Salamy et al. ..................... 430/331 |
| 5,334,332 | 8/1994 | Lee ..................... 134/2 X |
| 5,643,818 | 7/1997 | Sachdev et al. ..................... 437/51 |
| 5,688,411 | 11/1997 | Kutsuzawa et al. ..................... 216/92 |
| 5,849,467 | 12/1998 | Sato et al. ..................... 430/327 |

FOREIGN PATENT DOCUMENTS

| 63-34542 | 2/1988 | Japan . |
| 63-69563 | 3/1988 | Japan . |
| 63-278057 | 11/1988 | Japan . |
| 442523 | 2/1992 | Japan . |
| 4130715 | 5/1992 | Japan . |
| 5114555 | 5/1993 | Japan . |
| 5166720 | 7/1993 | Japan . |
| 5175117 | 7/1993 | Japan . |
| 5200350 | 8/1993 | Japan . |
| 6645302 | 2/1994 | Japan . |
| 6324499 | 11/1994 | Japan . |
| 7128867 | 5/1995 | Japan . |
| 7146562 | 6/1995 | Japan . |
| 7160008 | 6/1995 | Japan . |
| 8102434 | 4/1996 | Japan . |
| 897205 | 4/1996 | Japan . |

*Primary Examiner*—Zeinab El-Arini
*Attorney, Agent, or Firm*—Carrier, Blackman & Associates, P.C.; Joseph P. Carrier; William D. Blackman

[57] ABSTRACT

In a method of removing a coating from an edge of a substrate a solvent reservoir is filled with a solvent to dissolve and remove a photoresist film, the solvent includes one of dipropylene glycol monoalkyl ether, a mixture of this ether and an easily volatile organic solvent (boiling point of 75–130° C., vapor pressure of 5–75 mmHg at 20° C.), and an alkaline aqueous solution, an edge of a substrate W is horizontally inserted in the reservoir, and thereafter, the edge of the substrate W is immersed in the solvent for a period of time, so as to dissolve and remove a coating such as photoresist from the edge of the substrate. The solvent may be filled into the solvent reservoir either before or after the edge of the substrate is inserted therein, and the method may further involve aspirating the solvent from the reservoir after the substrate edge has been inserted therein.

22 Claims, 8 Drawing Sheets

(a)

(b)

(c)

6,015,467

METHOD OF REMOVING COATING FROM EDGE OF SUBSTRATE

This application is a continuation-in-part (CIP) of copending application U.S. Ser. No. 08/612,723, filed Mar. 8, 1996 (now U.S. Pat. No. 5,688,411). This application is also a continuation-in-part (CIP) of copending application U.S. Ser. No. 08/788,442, filed Jan. 28, 1997 (now U.S. Pat. No. 5,849,467) and a CIP of copending application 08/857,485, filed May 16, 1997, pending.

BACKGROUND OF THE INVENTION

1. Field of the Invention

The present invention relates to a method of removing a coating from an edge of a substrate such as a glass substrate, a semiconductor wafer or the like.

2. Description of the Relevant Art

The process of fomling an integrated circuit on a substrate includes the step of forming a photoresist film on the substrate by spreading a dropped photoresist solution uniformly over the substrate upon rotation of the substrate.

According to the above step of forming a photoresist film on the substrate, as shown in FIG. 5(a) of the accompanying drawings, the photoresist film, indicated by R, includes a thick edge portion R' deposited on an edge of the substrate, indicated by W. When the photoresist film R is removed after being etched, the thick edge portion R' is left on the edge of the substrate W. In subsequent steps, the remaining edge portion R' becomes a source of small contaminating particles which are deposited on the surface of the substrate W, resulting in a poor yield of integrated circuits. this problem also occurs in the formation of a SOG (Spin-On-Glass) film on a substrate.

There have heretofore been proposed various methods of removing a coating from an edge of a substrate. For example, methods of removing a photoresist film from an edge of a rectangular glass substrate are disclosed in Japanese laid-open patent publications Nos. 5-114555, 5-175117, and 5-200350, and methods of removing a photoresist film from an edge of a semiconductor wafer are disclosed in Japanese laid-open patent publications Nos. 5-166720 and 6-45302.

According to the methods disclosed in Japanese laid-open patent publications Nos. 5-114555 and 5-175117, a nozzle for ejecting a solvent to dissolve and remove a photoresist film is moved along an edge of a substrate.

The method disclosed in Japanese laid-open patent publication No. 5-200350 involves use of a nozzle for ejecting a solvent to dissolve and remove a photoresist film, which nozzle is positioned below a rectangular glass substrate. In operation, the solvent is applied from the nozzle to the reverse side of the rectangular glass substrate to remove a photoresist film from an edge thereof.

The method disclosed in Japanese laid-open patent publication No. 5-166720 includes a nozzle having a solvent dropping port and a gas supply port which are defined in an upper arm thereof and a suction port defined in a lower arm thereof. When the method is in operation, an edge of a semiconductor wafer, from which a photoresist film is to be removed, is positioned in the nozzle between the upper and lower arms thereof.

According to the method disclosed in Japanese laid-open patent publication No. 6-45302, a photoresist film on upper and lower surfaces of an edge of a semiconductor wafer is removed by a solvent ejected from nozzles positioned above and below the edge of the semiconductor wafer, and a photoresist film on an outer surface of the edge of the semiconductor wafer is removed by a rotary brush that is held against the outer surface of the edge of the semiconductor wafer.

As a solvent to dissolve and remove a photoresist film in the above methods of removing, there has widely been used propylene glycol monomethyl ether acetate, which is also used as a solvent for a photoresist film and has low toxicity and excels in safety, or a mixture of this and propylene glycol monomethyl ether.

In any of the above conventional arrangements, the dissolving solvent is continuously ejected from the nozzle, and hence a large amount of dissolving solvent is required to process the edges of substrates. Even when the ejected dissolving solvent is retrieved, the amount of retrieved dissolving solvent is relatively small, and the retrieved dissolving solvent is largely degraded. Therefore, the process of retrieving the ejected dissolving solvent is not cost-effective.

The efforts disclosed in the above publications except the method disclosed in Japanese laid-open patent publication No. 6-45302 fail to sufficiently remove the remaining photoresist film from the outer surface of the edge of the substrate, though they can remove the photoresist film from the upper and lower surfaces of the edge of the substrate. As a result, the thick edge portion R' partly remains on the outer surface of the edge of the substrate, as shown in FIG. 5(b) of the accompanying drawings, after the edge of the substrate has been cleaned by the methods disclosed in the former four publications. According to Japanese laid-open patent publication No. 6-45302, since the remaining photoresist film is scraped off the outer surface of the edge of the substrate by the rotary brush, the disclosed method requires two different removing mechanism, i.e., the nozzles and the rotary brush, and hence is complex in overall structure. Furthermore, the remaining photoresist film cannot completely be removed from the outer surface of the edge of the substrate by the rotary brush.

Additionally, the above conventional dissolving solvent has problems of failing to form a flat and vertical section of the photoresist film near an interface and leaving contaminating particles. These problems produce a harmful effect on subsequent steps.

SUMMARY OF THE INVENTION

According to the present invention, there is provided a method of removing a coating from an edge of a substrate, comprising the steps of initially filling a solvent reservoir with a solvent to dissolve and remove a photoresist film, horizontally inserting an edge of the substrate into the reservoir, and thereafter, immersing the edge of the substrate in the solvent within the reservoir for a period of time to dissolve and remove the coating from the edge of the substrate. The solvent comprises one of dipropylene glycol monoalkyl ether, a mixture of this and an easily volatile organic solvent (boiling, point of 75–130° C., vapor pressure of 5–75 mmHg at 20° C.), a mixture of dipropylene glycol monoalkyl ether 65–95 percent by weight and butyl acetate 5–35 percent by weight, and an alkaline aqueous solution.

The method of the invention may reverse the order of the first two steps in the above method, i.e., may comprise the steps of horizontally inserting the edge of the substrate in a solvent reservoir, thereafter, filling the solvent reservoir with a solvent to dissolve and remove a photoresist film, and immersing the edge of the substrate in the solvent within the reservoir for a period of time to dissolve and remove the coating from the edge of the substrate.

Further, it is possible to make the dissolution of a photoresist film or a SOG film rapid by oscillating the solvent, the solvent reservoir, or the substrate while removing the coating, and to make a rinse treatment and a dry treatment efficient after removing the coating by continuously ejecting at least one of a rinse such as pure water and or gas onto the substrate.

The substrate may be of a rectangular shape, and the method may further comprise the steps of fixing the substrate without rotation thereof, moving the solvent reservoir toward the substrate and removing the coating from one edge of the substrate or from two opposite edges thereof simultaneously.

Alternatively, the substrate may be of a circular shape including a linear orientation flat edge, and the method may further comprise the steps of rotating the substrate while an edge of a circular portion thereof is immersed in the solvent, and moving the solvent reservoir toward and away from the substrate horizontally when to the outer surface of the edge of the substrate including the linear orientation flat edge faces the solvent reservoir.

In the above-described method, the period of time during which the edge of the substrate is immersed in the solvent is preferably from 1 to 15 seconds.

DESCRIPTION OF THE PREFERRED EMBODIMENT(S)

Figure 1:
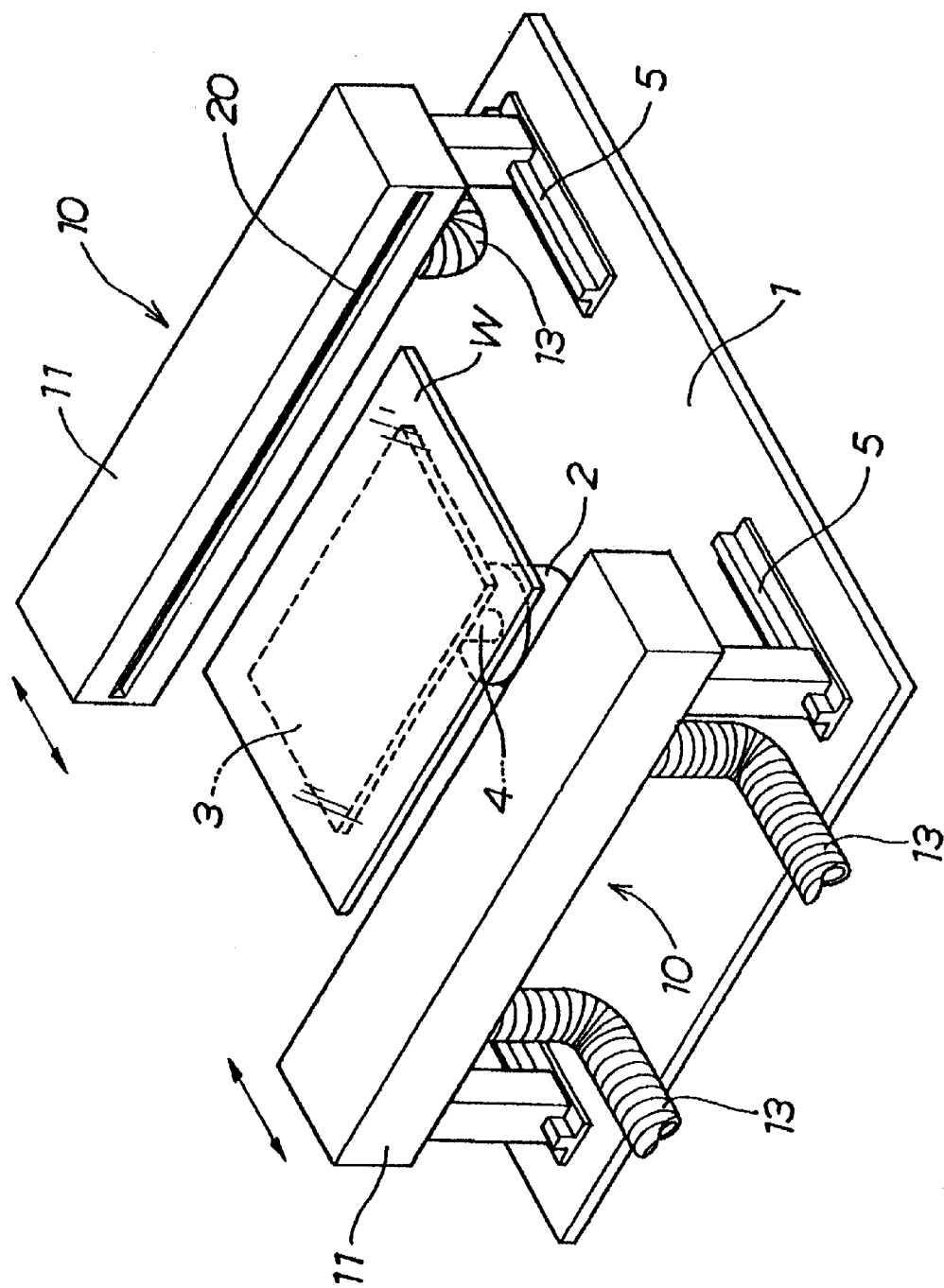
FIG. 1 is a perspective view of an apparatus for effecting a method of removing a coating from an edge of a substrate according to a preferred embodiment of the present invention.

Hereinafter, an explanation will be given in more detail about the preferred embodiments according to the present invention, by referring to the accompanying drawings. A photoresist film in the present invention may be either a positive type or a negative type. An example of a positive type is a photoresist film which includes alkali soluble novolac resin as a component for forming a photoresist film and naphthoquinone-1,2-diazide sulfonic acid ester as a photosensitive component. An example of a negative type is a photopolymer photoresist film which includes alkali soluble resin, monomer having an ethylene unsaturated double bond, a photopolymerization initiation agent, and a dye or a pigment.

A solvent to dissolve and remove a photoresist film in the present invention preferably comprises one of dipropylene glycol monoalkyl ether, a mixture of this and an easily volatile organic solvent (boiling point of 75–130° C., vapor pressure of 5–75 mmHg at 20° C.), an alkaline aqueous solution. As dipropylene glycol monoalkyl ether, it is preferable to use dipropylene glycol monomethyl ether, such as monoethyl ether, monopropyl ether, monobutyl ether or the like, because of their removability, safety and drying qualities.

Further, it is preferable to use as the dissolving and removing solvent a mixture of dipropylene glycol monoalkyl ether 65–95 percent by weight and an easily volatile organic solvent (boiling point of 75–130° C., vapor pressure of 5–75 mmHg at 20° C.) 5–35 percent by weight, taking into consideration the drying of the solvent on a substrate which has had a photoresist film removed therefrom.

Further, as a solvent to dissolve and remove a photoresist film, it is particularly preferable to use a mixture of dipropylene glycol monoalkyl ether 70–90 percent by weight and the easily volatile organic solvent 10–30 percent by weight. If the ratio of percent by weight of the easily volatile organic solvent is too large, the photoresist film tends to partly remain on the substrate after the edge of the substrate has been cleaned, and if it is too small, it is difficult to dry the substrate after the edge of the substrate has been cleaned.

Either dipropylene glycol monoalkyl ether alone or a mixture of this and an easily volatile organic solvent (boiling point of 75–130° C., vapor pressure of 5–75 mmHg at 20° C.) is preferably used for a positive type photoresist film. An alkaline aqueous solution is preferably used as the dissolving and removing solvent for a negative type photoresist film.

As the easily volatile organic solvent, it is preferable to use butyl acetate from among acetic acid low-level alkyl ester solvents such as: n-propyl acetate (boiling, point of 120° C., vapor pressure of 25 mmHg at 20° C.), isopropyl acetate (boiling point of 89° C., vapor pressure of 43 mmHg at 20° C.), n-butyl acetate (boiling point of 126° C., vapor pressure of 10 mmHg at 20° C.), isobutyl acetate (boiling point of 118° C., vapor pressure of 13 mmHg at 20° C.) or the like; low-level ketone solvent such as methyl ethyl ketone (boiling point of 80° C., vapor pressure of 71 mmHg at 20° C.), methyl propyl ketone (boiling point of 102° C., vapor pressure of 12 mmHg at 20° C.), methyl isobutyl ketone (boiling point of 116° C., vapor pressure of 17 mmHg at 20° C.), or the like; or, low-level alkylene glycol low-level monoalkyl ether solvents such as propylene glycol monometyl ether (boiling point of 120° C., vapor pressure of 8 mmHg at 20° C.), ethylene glycol monomethyl ether (boiling point of 125° C., vapor pressure of 6 mmHg at 20° C.), or the like.

The above-mentioned easily volatile organic solvent may be used singly or as a mixture of two kinds or more.

An alkaline aqueous solution may be a solution formed by dissolving organic and inorganic bases in water. Particularly preferable is a solution formed by dissolving at least one aqueous organic solvent selected from alcohol, glycol ether, or an aprotic dipolar solvent, and at least one alkali selected from alkanolamine, a cyclic nitride, or a quaternary ammonium salt in water.

As examples of the above aqueous organic solvent, there is alcohol, such as methyl alcohol, isopropyl alcohol or the like; glycol ether, such as ethylene glycol monomethyl ether, propylene glycol monomethyl ether, dipropylene glycol monometyl ether or the like; and an aprotic dipolar solvent, such as 1,3-dimethyl-2-imidazolidinone or the like.

As examples of the above-menitioned alkali, there is alkanolamine, such as monoethanolamine, diethanolamine, 2-(2-aminoethoxy) ethanol, or the like, a cyclic nitride, such as 2-hydroxyethylpyridine, N-methyl-2-pyrrolidone or the like; and, a quaternary ammonium salt, such as tetramethylammoniun hydroxide, trimethyl-2-hydroxyethylammonium hydroxide (choline), or the like.

The concentration of the aqueous organic solvent in an alkaline aqueous solution is generally 0.05–20 percent by weight, preferably 0.5–15 percent by weight, although it is properly defined by the type of photoresist film and other factors. The concentration of the alkali is generally 0.05–20 percent by weight, preferably 0.5–15 percent by weight, and the rest is water, although it is properly defined by the type of photoresist film aild so on.

As shown in FIGS. 1–4, an apparatus to embody a method of removing a photoresist film from an edge of a substrate according to the present invention comprises a substrate holder 2 mounted on a base 1 and a pair of removing units 10, 10 movably mounted on the base 1 in opposite directions parting right and left on the substrate holder 2. The substrate holder 2 comprises a vacuum chuck 3 for securely holding a lower surface of a substrate W such as a glass substrate, a semiconductor wafer, or the like, and a shaft 4 for rotating the vacuum chuck 3 about its own vertical axis.

Figure 2:
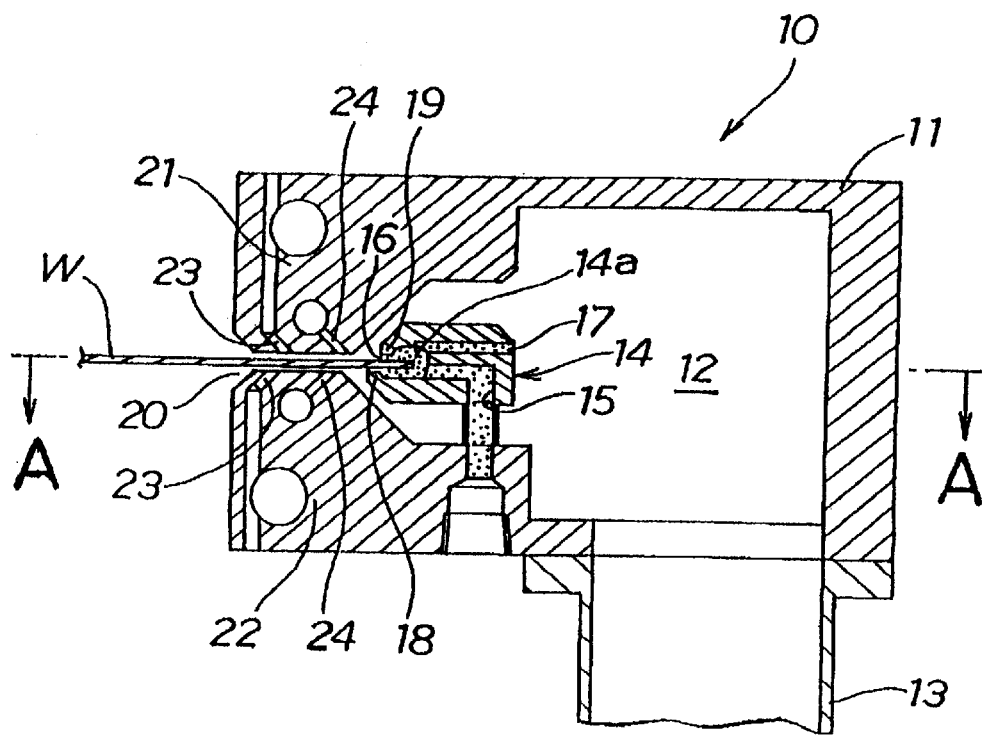
FIG. 2 is a vertical cross-sectional view of a removing unit of the apparatus shown in FIG. 1 when an edge of a substrate is inserted therein.

Two pairs of spaced linear guide rails 5, 5 are mounted on the base 1 remotely from the substrate holder 2, and the above-mentioned removing units 10, 10 move toward and away from the substrate holder 2 along the linear guide rails 5, 5. As shown in FIG. 2, the removing units 10 have cavities 12 inside horizontal cases 11, and the cavities 12 are connected to aspirators (not shown) through pipes 13.

Each of the above-mentioned cavities 12 has a washing member 14 in which a solvent reservoir 14a is disposed. Each solvent reservoir 14a has a supply hole 15 connected to a solvent supply, a slot 16 which opens in a side direction, and an overflow hole 17.

Accordingly, by driving the aspirators, an ample amount of solvent to dissolve and remove a photoresist film in the solvent reservoir 14a is discharged through each overflow hole 17 and the cavity 12.

A vertical size of the above-mentioned slot 16 is a size in which the solvent to dissolve and remove the photoresist film inside of the slot 16 is supported by the surface tension thereof. More specifically, the vertical size is the interval between an upper surface of the substrate W and an upper edge of the slot 16 and between a lower surface of W and a lower edge of the slot when the substrate W is inserted in the slot. Although the size is properly defined on the basis of the surface tension of the solvent used to dissolve and remove the photoresist film, generally it is defined to be below 1 mm.

A horizontal size or length of the slot 16 is defined to be larger than the size of a longer edge of the substrate W to some extent.

Further, a lower edge 18 of the washing member which forms the slot 16 of the solvent reservoir 14a projects further forward than an upper edge 19. Therefore, it is possible to make the range of surface, are a in which the lower surface of the substrate W contacts the solvent wider than the range of surface are a in which the upper surface thereof contacts the solvent.

A side of the horizontal case 11 which faces the substrate W is separated into an upper thickness 21 and a lower thickness 22 by a slot 20, and the thicknesses 21, 22 each have nozzle holes 23 and 24 which open into the slot 20. $N_2$, $O_2$ or air is ejected from the nozzle hole 23 in a slant direction toward the above-mentioned slot 16, and a rinse such as pure water or the like is ejected from the nozzle hole 24 in a slant direction toward the above-mentioned slot 16.

Because the range in which the lower surface of the substrate W contacts the solvent is wider than the range in which the upper surface thereof contacts the solvent, the nozzle holes 23, 24 of the lower thickness 22 are shifted away from the edge of the substrate W in comparison with those of the upper thickness 21.

In order to conduct a removing operation, first, it is necessary that the pair of removing units 10, 10 are moved apart from each other as far as possible, that the central lower surface of the substrate W is supported by the chuck 3 and that the slot 20 of the removing unit 10 is parallel to one edge of the substrate W so as to dissolve and remove a photoresist film from an edge of the substrate W by a solvent within the washig member 14.

Second, the pair of removing units 10, 10 are moved toward the substrate W until right and left edges of the substrate W are inserted into the solvent reservoir 14a via the slot 20 of each removing unit 10 and the slot 16 of each solvent reservoir 14a. In this specifcation, especially hereinafter, although the description may refer to only one of the removing units 10, it is to be understood that the description applies equally to the other removing unit.

The solvent reservoir 14a may be filled with a solvent to dissolve and remove a photoresist film, in advance or after inserting the substrate W in the solvent reservoir 14a.

Figure 3:
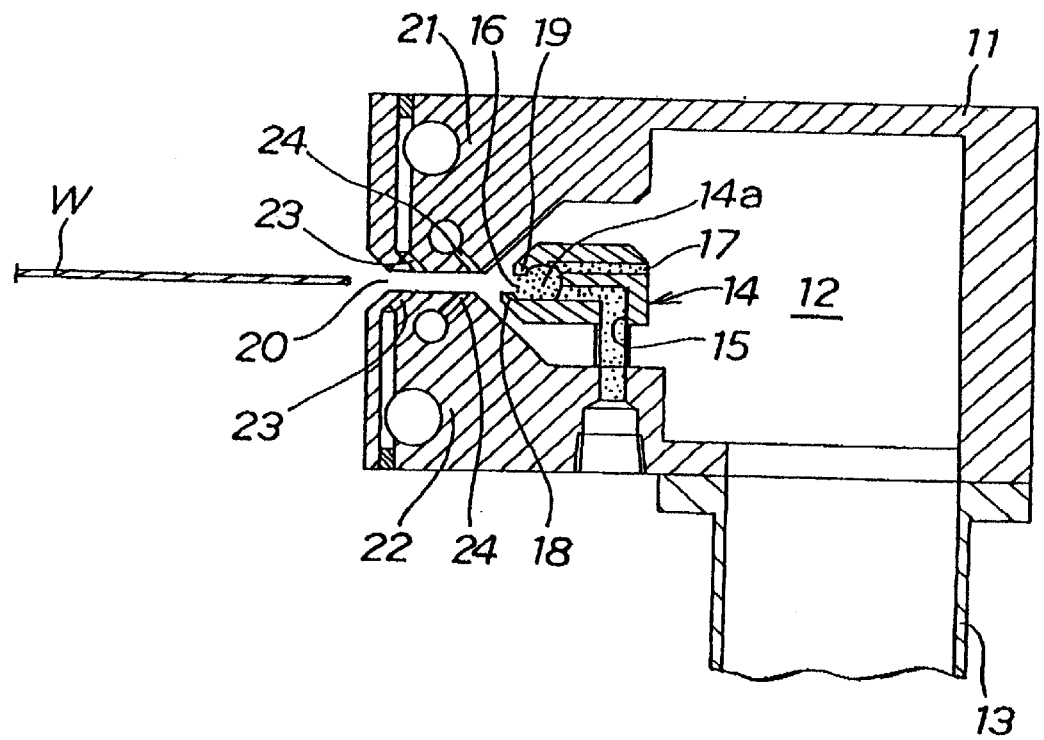
FIG. 3 is a vertical cross-sectional view of a removing unit of the apparatus shown in FIG. 1 after an edge of a substrate is pulled therefrom.
Figure 4:
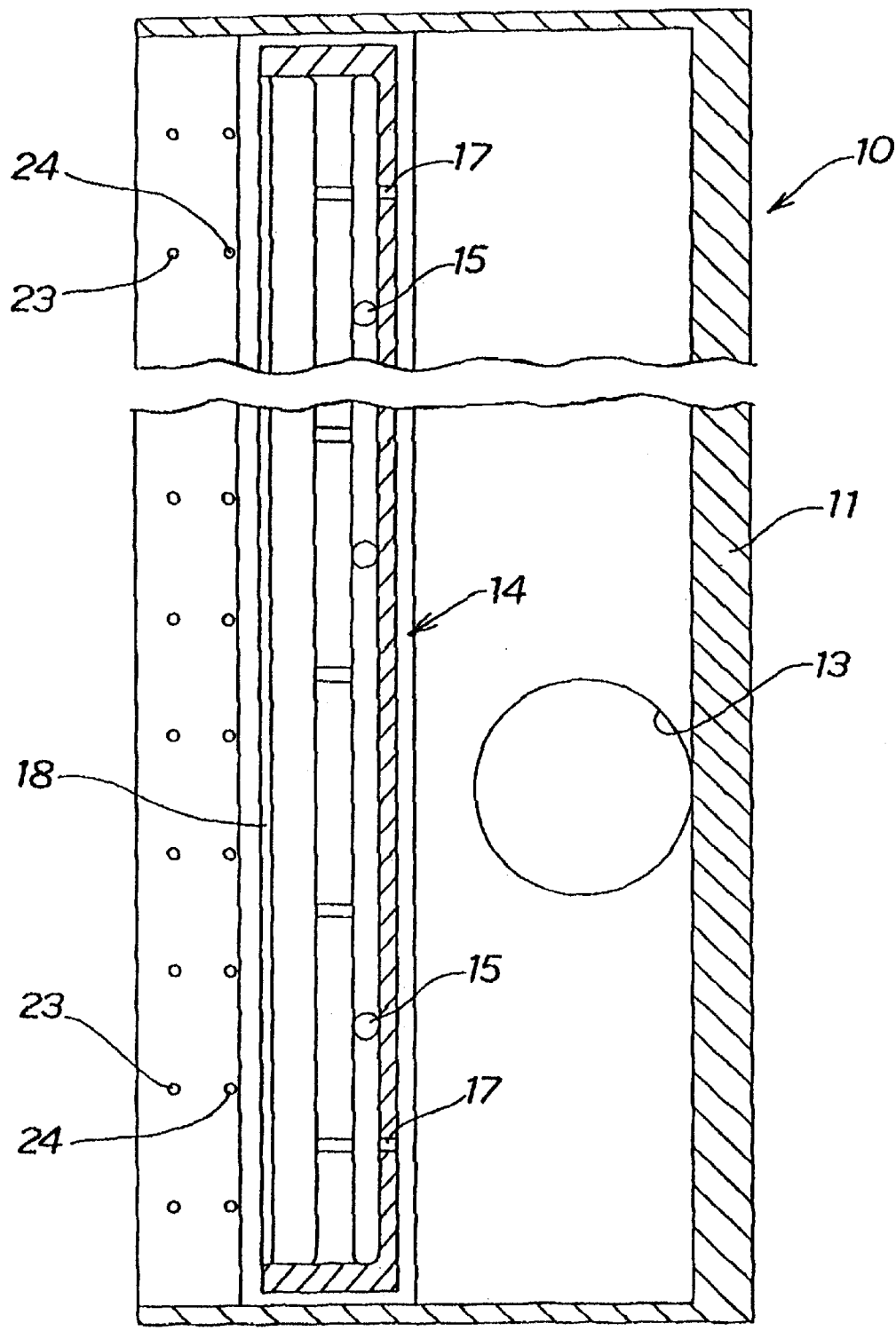
FIG. 4 is a horizontal cross-sectional view of a removing unit taken along line A—A shown in FIG. 2.

Then, the edge of the substrate W is immersed in the solvent for a period of time equal to 1–15 second(s) and a photoresist film is dissolved and removed from the edge of the substrate. Thereafter, the pair of removing units 10, 10 are moved in the opposite direction away from the edges of the substrate W, and the edge of the substrate W is pulled from the solvent reservoir 14a, as shown in FIG. 3.

At that time, by ejecting gas and pure water from nozzle holes 23, 24, respectively, onto the edge of the substrate W, the rest of the photoresist film is removed from the edge of the substrate W and the edge of the substrate W is washed and lightly dried.

In the above operation, the removing unit 10 or the substrate W may be oscillated. As a result, it is possible to make faster progress in dissolving the photoresist film and to apply the gas and pure water, as ejected from nozzle holes 23, 24, onto the edge of the substrate W uniformly.

After removing the photoresist film from the two opposite edges of the substrate W simultaneously, the chuck 3 of the substrate holder 2 is so that the substrate W is turned 90°, and the photoresist film is removed from the other two edges thereof simultaneously by the same above-mentioned operation of the two removing units 10, 10.

Figure 5:
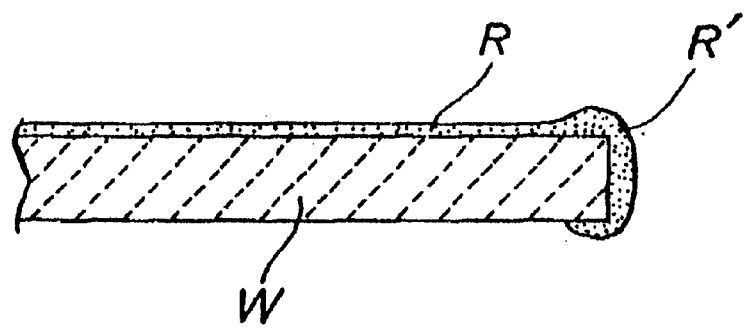
FIG. 5(a) is a fragmentary cross-sectional view of an edge of a substrate before a coating is removed therefrom.
FIG. 5(b) is a fragmentary cross-sectional view of an edge of a substrate on which a coating partly remains after the edge of the substrate has been cleaned.
FIG. 5(c) is a fragmentary cross-sectional view of an edge of a substrate from which a coating is removed by the apparatus according to the present invention.
Figure 5:
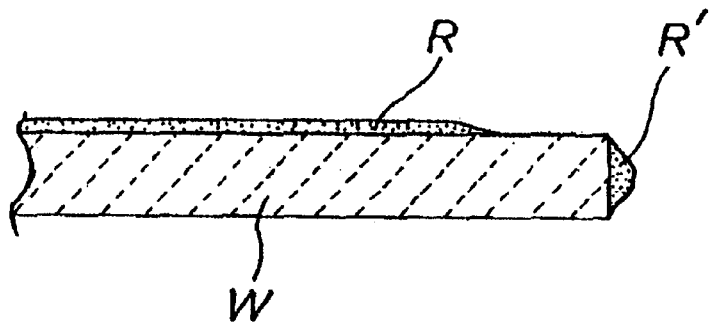
Figure 5:
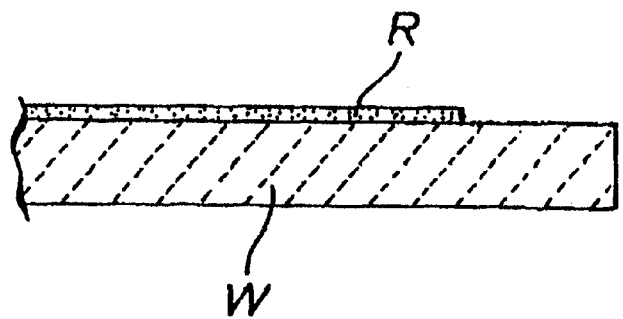

As shown in FIG. 5(c), the photoresist film can be fully removed from upper, lower, and outer surfaces of the edge of the substrate W according to the method of the present invention.

Figure 6:
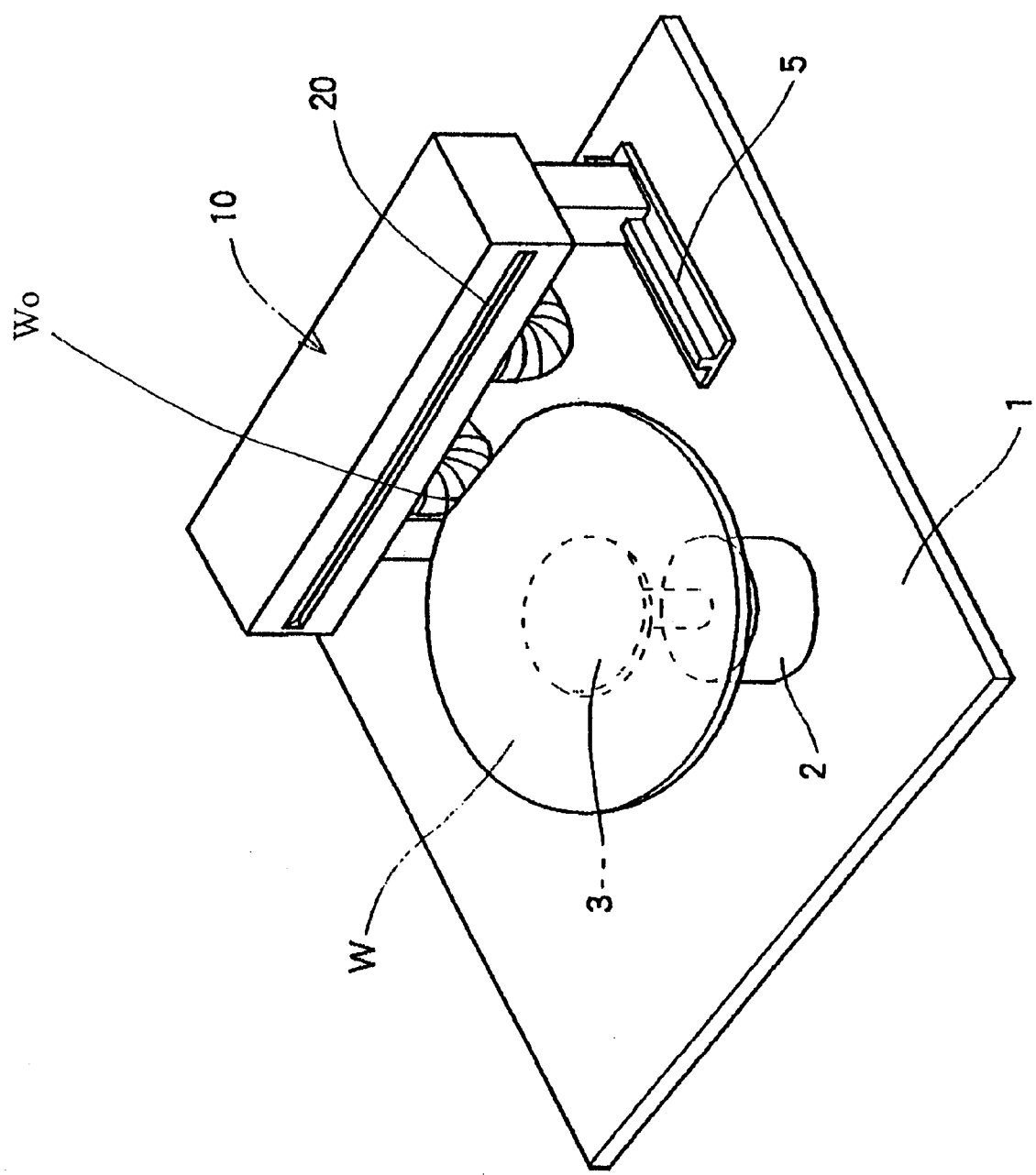
FIG. 6 is a prespective view showing the manner in which a coating is removed from an edge of a circular semiconductor wafer by the apparatus according to the present invention.

FIG. 6 shows the apparatus used according to the present invention to remove a photoresist film from an edge of a circular semiconductor wafer. The semiconductor wafer W has a linear orientation flat edge Wo for positioning the semiconductor wafer W and an arcuate edge contiguous to the linear orientation flat edge Wo.

For removing a photoresist film from an edge of the above-mentioned semiconductor wafer W, a removing unit 10 having essentially the same structure as described above may be disposed to one side as shown in FIG. 6 and a slot 20 which is formed in the removing unit 10 may be a little longer than the linear orientation flat edge Wo. After the removing unit 10 is horizontally moved toward the semiconductor wafer W, the edge of the linear orientation flat edge Wo is inserted into the solvent reservoir of the removing unit 10 and the edge thereof is immersed in the solvent for a time period as stated above so as to remove the photoresist film. Then, the semiconductor wafer W is rotated slowly on the spot, the removing unit 10 is horizontally moved backward and the arcuate edge of the semiconductor wafer W is continuously immersed in the solvent reservoir to remove the photoresist film.

When a photoresist film is removed from an edge of a semiconductor wafer W, the removing process may be started with the water W in any position and the form of the solvent reservoir may be different from that described above.

Figure 7:
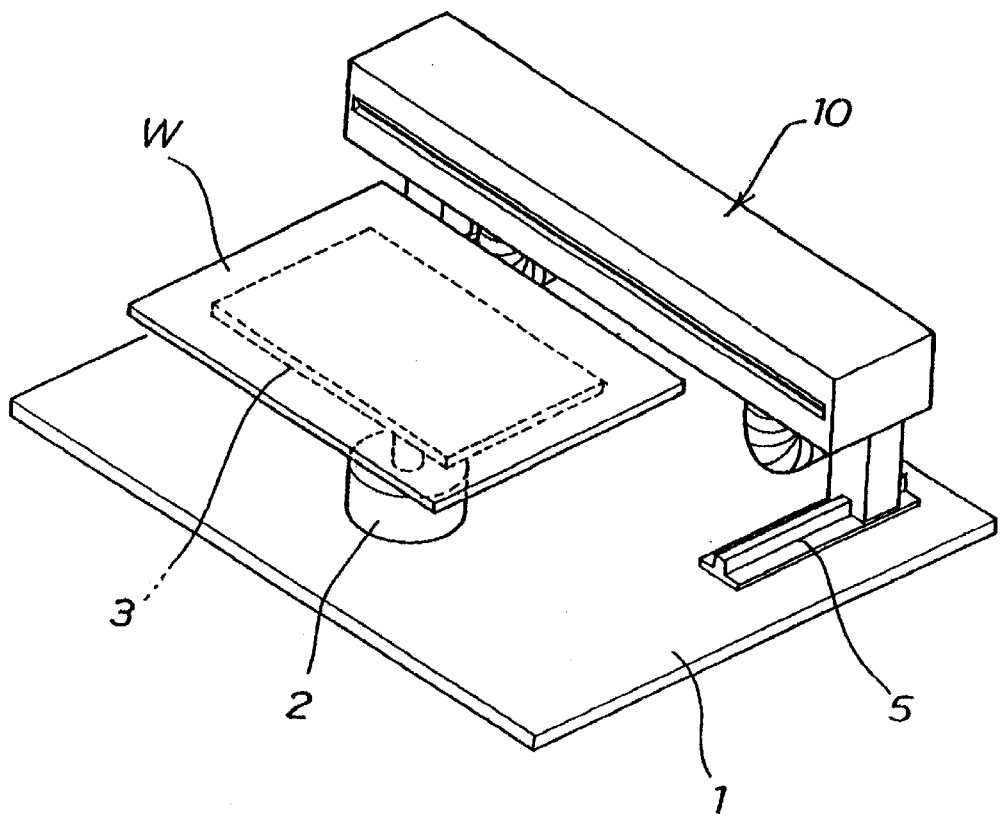
FIG. 7 is a prespective view showing the manner in which a coating is removed from an edge of a substrate by a single removing unit.

FIG. 7 shows an apparatus in which a photoresist film is removed from an edge of a glass substrate with an apparatus comprising one removing unit. Although this apparatus takes more time than the apparatus shown in FIG. 1, it is possible thereby to simplify the structure of the apparatus.

Figure 8:
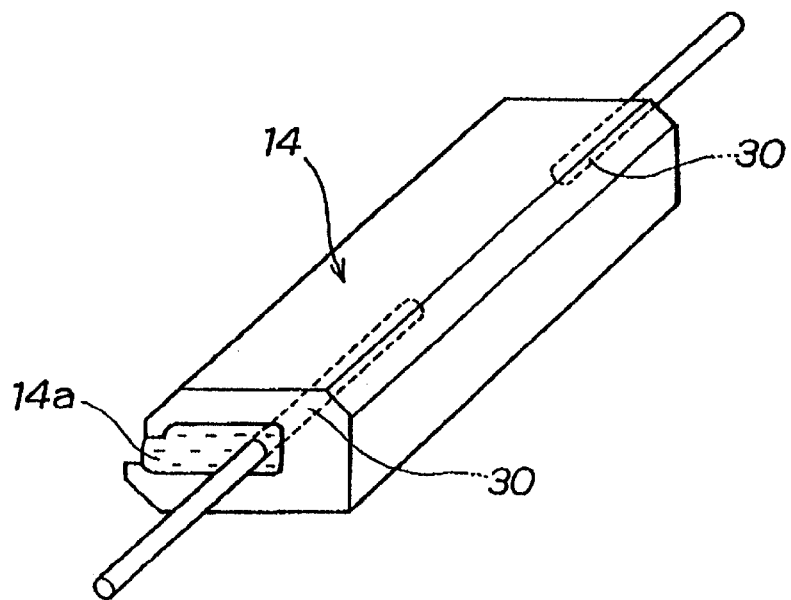
FIG. 8 is a prespective view of a washing member furnished with a ultrasonic oscillator according to one preferred embodiment of the invention.
Figure 9:
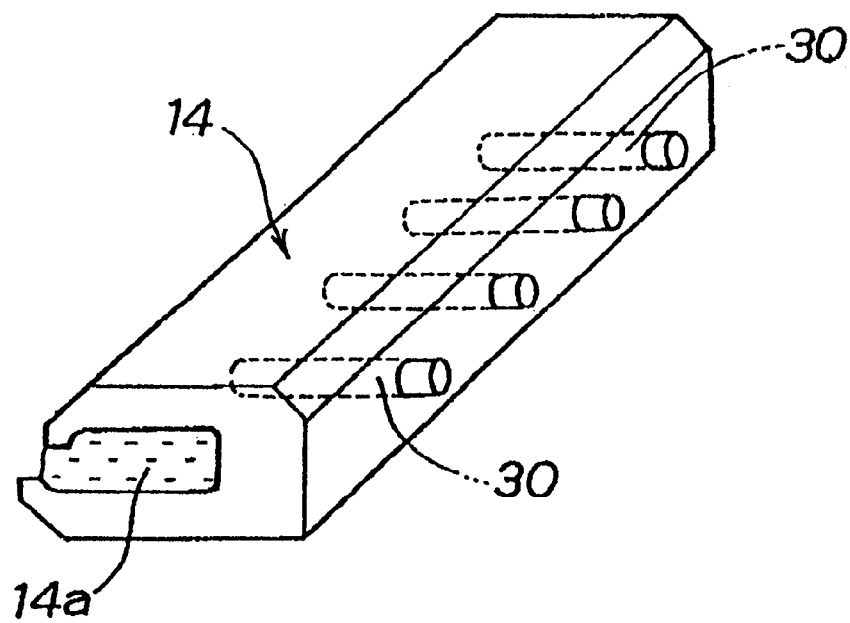
FIG. 9 is a prespective view of a washing member furnished with an ultrasonic oscillator according to another embodiment.
Figure 10:
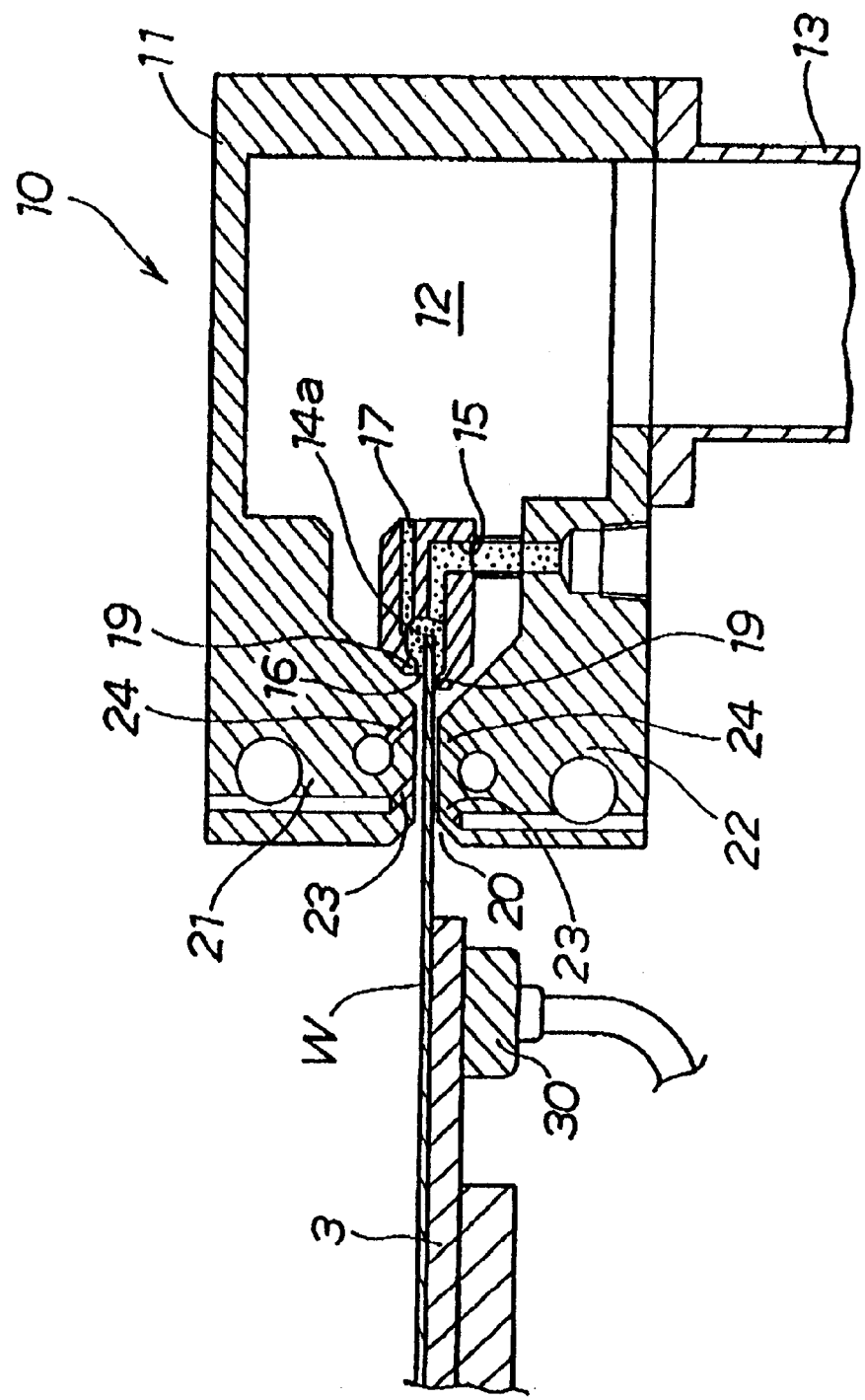
FIG. 10 is a vertical cross-sectional view of a removing apparatus similar to FIG. 2, but the apparatus is furnished with an ultrasonic oscillator.

FIGS. 8–10 show apparatus in which means for generating ultrasonic oscillations are additionally provided. In the embodiment shown in FIG. 8, ultrasonic oscillators 30 are directly inserted in the solvent reservoir 14a of the washing member 14. In the embodiment shown in FIG. 9, a plurality of ultrasonic oscillators 30 are disposed in the washing member 14 and the solvent in the solvent reservoir 14a is oscillated via the oscillations of the washing member 14. In the embodiment shown in FIG. 10, ultrasonic oscillators 30 are disposed in a vacuum chuck 3 for securely holding the glass substrate or a semiconductor wafer W. Although it is not shown in the figure, it is also possible to oscillate either the removing unit 10 or the base 1.

The solvent used to dissolve and remove a photoresist film in the present invention has the advantages in that it is non-toxic to the human body, it is capable of dissolving and removing a photoresist film in a short period of time, it is capable of forming a flat and vertical section of a photoresist film near an interface, it can dissolve a photoresist film sufficiently so as not to leave any contaminating particles, and it has excellent drying properties.

The efficacy of the method of removing a photoresist film from an edge of a substrate according to the present invention was evaluated with respect to its capability in dissolving and removing, the resulting form of the section of photoresist film, and its capability in drying by the following method.

(1) Capability in Dissolving and Removing

After a positive type photoresist film (OFPR PR-11, produced by the Tokyo Ohka Kogyo Co., Ltd.), which contains a compound containing quinone diazide compound and a cresol novolac resin, was coated on a surface of a rectangular glass substrate (550 mm×650 mm) which has a chrome layer, the photoresist film was dried under reduced pressure so as to be 1.1 $\mu$m thick.

Next, after the substrate was treated with a solvent in a solvent reservoir for eight seconds by the method of removing a coating from an edge of a substrate according to the present invention, the substrate was exhausted and dried. The results of removing an unnecessary part of the photoresist film were observed by eye, and the portions where it was fully removed were ranked as A, the portions where it was slightly left behind as B, and the portions where it was considerably left behind as C.

(2) Resulting Section Form of Photoresist Film

When an unnecessary part of the photoresist film is fully removed, the section (profile) of the photoresist film which is removed from an edge of the substrate was measured with a pointer touch-type of measure to determine any difference in level (trade name DEKTAK, produced by the Japan Vacuum Technology Co., Ltd.), and any section which has no swell near the interface was ranked as A and any section which has some swell was ranked as B.

(3) Capability in Drying

After the substrate was treated with a solvent in a solvent reservoir by the method of removing a coating from an edge of a substrate according to the present invention, the substrate from which the photoresist film was removed was observed by eye, and the case where no solvent was left was ranked as A, and the case where some solvent was left as B.

The efficacy of Invention Examples 1–4 and of Comparative Examples 1, 2, in the case where a method of removing a coating from an edge of a substrate according to the present invention was embodied by using solvents in various combinations is shown in Table 1:

TABLE 1

| | Solvent Composition (percent by weight) | Dissolving and Removing Efficacy | Resulting Section Form of Photoresist Film | Drying Efficacy |
|---|---|---|---|---|
| Example | | | | |
| 1 | DPM (100) | A | A | B |
| 2 | DPM:BuAC (90:10) | A | A | A |
| 3 | DPM:BuAC (80:20) | A | A | A |
| 4 | DPM:BuAC (70:30) | B | A | A |
| Comparative Example | | | | |
| 1 | PGMEA (100) | C | B | A |
| 2 | PGMEA:PGME (30:70) | C | B | A |

NOTES:
DPM: dipropylene glycol monomethyl ether
BuAC: butyl acetate
PGMEA: propylene glycol monomethyl ether acetate
PGME: propylene glycol monomethyl ether Further testing was performed in relation to other Invention Examples 5–9, as follows.

While the rest of the factors are in the same condition as (1) Efficacy in Dissolving and Removing described above, the rectangular glass substrate was exchanged for a rectangular glass substrate (400 mm×500 mm) which does not have a chrome layer, the positive type photoresist film was exchanged for a negative type photopolymer photoresist film (COLOR MOSAIC CB-6011L, produced by the Fuji Hunt Electronics Technology Co., Ltd.) and this photoresist film was dried to be 2.0 μm thick.

Next, the substrate was treated in a solvent reservoir with a solvent having the compositions shown in Table 2 for five seconds by the method of removing a coating from an adge of a substrate according to the present invention. The efficacy was similarly evaluated with respect to conditions (1) and (2) described above. The results are shown in Table 2 as Invention Examples 5–9:

TABLE 2

| Example | Solvent Composition (weight) | Dissolving and Removing Efficacy | Resulting Section Form of Photoresist Film |
| --- | --- | --- | --- |
| 5 | TMAH (3), DPM (8), Water (89) | A | A |
| 6 | TMAH (5), DMI (15), Water (80) | A | A |
| 7 | TMAH (5), NMP (12.5), Water (82.5) | A | A |
| 8 | TMAH (5), HP (4.6), DMI (9.2), Water (81.2) | A | A |
| 9 | AEE (3), PGME (10), Water (87) | A | A |

NOTES: Aqueous Organic Solvent:
DPM: dipropylene glycol monomethyl ether
DMI: 1,3-dimethyl-2-imidazolidinone
PGME: propylene glycol monomethyl ether
Alkali:
TMAH: tetramethylammonium hydroxide
NMP: N-methyl-2-pyrrolidone
HP: 2-hydroxyethylpyridine
AEE: 2-(2-aminoethoxy)ethanol As shown in the above, by using the stated solvent to dissolve and remove a photoresist film, the present invention has the advantages in that it is non-toxic to the human body, it is capable of dissolving and removing a photoresist film in a short period of time, it is capable of forming a flat and vertical section of a photoresist film near an interface, it can dissolve a photoresist film sufficiently so as not to leave any contaminating particles, and it has excellent drying properties.

A comparative test was conducted between the method according to the present invention and on a conventional method to remove a photoresist film from an edge of a rectangular substrate having a size of 600 mm×600 mm. In the test, the method according to the present invention consumed 20 to 30 cc of solvent, whereas the conventional method consumed 200 to 300 cc of solvent.

Because the method according to the present invention removes a photoresist film from an edge of a substrate while the substrate is kept horizontally positioned, the method can smoothly receive a substrate from and transfer a substrate to other processes, and hence can easily be incorporated in a continuous processing line for fabricating integrated circuits or the like.

Further, because a photoresist film can be fully removed from an outer surface of the edge of a substrate W, it is possible to sharply diminish the generation of contaminating particles on the surface of the substrate and improve the yield of integrated circuits.

By oscillating the substrate or the solvent reservoir during the removing operation, it is possible to make the dissolution of a photoresist film rapid, and by treating the edge with gas and pure water as described, it is possible to make an efficient rinse and drying treatment.

If the substrate is of a rectangular shape, by defining the size of the slot in the solvent reservoir to be longer than that of the longest edge of the substrate and by mounting a pair of removing units in opposite directions parting right and left on a substrate holder, it is possible to remove a photoresist film from edges of the substrate efficiently and simultaneously.

If the substrate is of a circular shape including a linear orientation flat edge, by moving the removing units toward and away from the substrate and rotating the substrate, it is possible to remove a photoresist film from an outer surface of the edge of the substrate efficiently.

Further, by oscillating a solvent, a washing member or a substrate with ultrasonic oscillators, it is possible to promote the efficiency of dissolving the photoresist or other coating.

Although there have been described what are at present considered to be the preferred embodiments of the invention, it will be understood by persons skilled in the art that variations and modifications may be made thereto without departing from the spirit or essence of the invention. The scope of the invention is indicated by the appended claims, rather than by the foregoing description of the presently preferred embodiments.

What is claimed is:

1. A method of removing a coating from an edge of a substrate, comprising the steps of:

filling a solvent reservoir with a solvent to dissolve and remove a photoresist film, the solvent consisting essentially of one of dipropylene glycol monoalkyl ether alone, a mixture of said ether and a volatile organic solvent having a boiling point of 75–130° C., vapor pressure of 5–75 mm Hg at 20° C., and an alkaline aqueous solution formed by dissolving in water 0.05–20% by weight aqueous organic solvent and 0.05–20% by weight alkali, in advance;

horizontally inserting an edge of a substrate into said reservoir; and thereafter, immersing said edge of said substrate in said solvent for a period of time to dissolve and remove the coating from said edge of said substrate.

2. A method according to claim 1, wherein said solvent consists essentially of a mixture of dipropylene glycol monoalkyl ether 70–90 percent by weight and butyl acetate 10–30 percent by weight.

3. A method according to claim 1, wherein said solvent consists essentially of an alkaline aqueous solution formed by dissolving in water at least one aqueous organic solvent selected from among alcohol, glycol ether, and an aprotic dipolar solvent and at least one alkali selected from among alkanoamine, a cyclic nitride and a quaternary ammonium salt.

4. A method according to claim 3, wherein said aqueous organic solvent is selected from among a group consisting essentially of methyl alcohol, isopropyl alcohol, ethylene glycol monomethyl ether, propylene glycol monomethyl ether, dipropylene glycol monomethyl ether and 1,3-dimethyl-2-imidazolidinone, and said alkali is selected from among a group consisting essentially of monoethanolamine, diethanolamine, 2-(2-aminoethoxy) ethanol, 2-hydroxyethylpyridine, N-methyl-2-pyrrolidone and tetramethylammonium hydroxide.

5. A method according to claim 1, wherein at least one of said solvent, said solvent reservoir and said substrate is oscillated while said edge is immersed in said solvent.

6. A method according to claim 5, wherein said at least one of said solvent, said solvent reservoir and said substrate are oscillated ultrasonically.

7. A method according to claim 1, wherein said substrate is of a rectangular shape and said edge thereof is horizontally inserted in said solvent reservoir.

8. A method according to claim 1, wherein said substrate is of a rectangular shape and two opposite edges thereof are horizontally inserted into a pair of said solvent reservoirs, respectively, so as to remove said photoresist film from the two opposite edges of the substrate simultaneously.

9. A method according to claim 1, wherein said substrate is of a circular shape including a linear orientation flat edge, and said substrate is rotated by a chuck and the solvent reservoir is moved toward and away from the substrate, so as to remove the photoresist film from the outer surface of the edge of the substrate.

10. A method according to claim 1, wherein said solvent consists essentially of 70–90% by weight dipropylene glycol monoalkyl ether and 10–30% by weight of said volatile organic solvent.

11. A method of removing a coating from an edge of a substrate, comprising the steps of:

horizontally inserting an edge of the substrate in a solvent reservoir;

thereafter, filling said solvent reservoir with a solvent to dissolve and remove a photoresist film, the solvent consisting essentially of one of dipropylene glycol monoalkyl ether alone, a mixture of said ether and a volatile organic solvent having a boiling point of 75–130° C., vapor pressure of 5–75 mm Hg at 20° C., and an alkaline aqueous solution formed by dissolving in water 0.05–20% by weight aqueous organic solvent and 0.05–20% by weight alkali; and immersing said edge of said substrate in said solvent for a period of time to dissolve and remove the coating from the edge of the substrate.

12. A method according to claim 11, wherein said solvent consists essentially of a mixture of dipropylene glycol monoalkyl ether 70–90 percent by weight and butyl acetate 10–30 percent by weight.

13. A method according to claim 11, wherein said solvent consists essentially of an alkaline aqueous solution formed by dissolving in water at least one aqueous organic solvent selected from among alcohol, glycol ether, and an aprotic dipolar solvent, and at least one alkali selected from among alkanoamine, a cyclic nitride and a quaternary ammonium salt.

14. A method according to claim 13, wherein said aqueous organic solvent is selected from a group consisting essentially of methyl alcohol, isopropyl alcohol, ethylene glycol monomethyl ether, propylene glycol monomethyl ether, dipropylene glycol monomethyl ether and 1,3-dimethyl-2-imidazolidinone, and said alkali is selected from a group consisting essentially of monoethanolamine, diethanolamine, 2-(2-aminoethoxy) ethanol, 2-hydroxyethylpyridine, N-methyl-2-pyrrolidone and tetramethylammonium hydroxide.

15. A method according to claim 11, wherein at least one of said solvent, said solvent reservoir and said substrate is oscillated while said edge is immersed in said solvent.

16. A method according to claim 15, wherein said at least one of said solvent, said solvent reservoir and said substrate are oscillated ultrasonically.

17. A method according to claim 11, wherein said substrate is of a rectangular shape and two opposite edges thereof are horizontally inserted into a pair of said solvent reservoirs, respectively, so as to remove said photoresist film from the two opposite edges of the substrate simultaneously.

18. A method according to claim 11, wherein said substrate is of a circular shape including a linear orientation flat edge, and said substrate is rotated by a chuck and the solvent reservoir is moved toward and away from the substrate, so as to remove the photoresist film from the outer surface of the edge of the substrate.

19. A method according to claim 11, wherein said solvent consists essentially of 70–90% by weight dipropylene glycol monoalkyl ether and 10–30% by weight of said volatile organic solvent.

20. A method according to claim 11, wherein said substrate is of a rectangular shape and said edge thereof is horizontally inserted in said solvent reservoir.

21. A method of removing a coating from an edge of a substrate, comprising the steps of:

supplying solvent into slots in a pair of removing units;

passing the solvent in the slots in the removing units;

horizontally inserting two opposite edges of a rectangular substrate respectively into said slots in said pair of said removing units such that said opposite edges are immersed in the solvent in said slots; and maintaining the edges in the slots sufficiently long for the solvent to remove a coating from the edges.

22. A method according to claim 21, wherein said solvent consists essentially of one of dipropylene glycol monoalkyl ether alone, a mixture of said ether and a volatile organic solvent having a boiling point of 75–130° C., vapor pressure of 5–75 mm Hg at 20° C., and an alkaline aqueous solution formed by dissolving in water 0.05–20% by weight aqueous organic solvent and 0.05–20% by weight.

* * * * *

UNITED STATES PATENT AND TRADEMARK OFFICE
CERTIFICATE OF CORRECTION

PATENT NO : 6,015,467
DATED : January 18, 2000
INVENTOR(S): K. Nagasawa, N. Kawaguchi, F. Shimai, M. Sato, K. Harada, J. Koshiyama It is certified that error appears in the above-identified patent and that said Letters Patent is hereby corrected as shown below:

Column 1, line 19, change "fomling" to --forming--.

Column 2, line 58, after "boiling" delete the comma.

Column 3, line 8, change "and or" to --and--;
line numbered between 21 and 22, change "when to" to --when--;
line 51, change "prespective" to --perspective--;
line numbered between 55 and 56, change "prespective" to --perspective--;
line numbered between 58 and 59, change "prespective" to --perspective--;
line numbered between 59 and 60, change "a ultrasonic" to --an ultrasonic--;
line 62, change "prespective" to --perspective--.

Column 4, line numbered between 20 and 21, after the comma insert --and--;
line 53, after "boiling" delete the comma;
line 54, change "120°C." to --102°C.--;
line 66, change "monometyl" to --monomethyl--.

Column 5, line numbered between 16 and 17, change "monometyl" to --monomethyl--;
line numbered approximately 19, change "above-menitioned" to --above-mentioned--;
line 23, change "tetramethy-" to --tetramethyl- --;
line 24, change "lammoniun" to --ammonium--;
line 33, change "aild" to --and--.

Column 6, line 11, change "surface, are a" to --surface area--;
line 13, change "are a" to --area--;
line numbered between 36 and 37, change "washig" to --washing--;
line numbered between 41 and 42, change "specifcation" to --specification--.

UNITED STATES PATENT AND TRADEMARK OFFICE
CERTIFICATE OF CORRECTION

PATENT NO : 6,015,467
DATED : January 18, 2000
INVENTOR(S): K. Nagasawa, N. Kawaguchi, F. Shimai, M. Sato, K. Harada, J. Koshiyama It is certified that error appears in the above-identified patent and that said Letters Patent is hereby corrected as shown below:

Column 7, line 1, before "so" insert --rotated--.

Column 9, line 7, change "adge" to --edge--.

Column 10, line 9, change "units" to --unit--.

Column 12, line 48 (claim 22, 7th line), after "and" insert --alkali--.

Signed and Sealed this

Twenty-sixth Day of December, 2000

*Attest:*

Q. TODD DICKINSON

*Attesting Officer*      *Director of Patents and Trademarks*